United States Patent [19]

Mueller et al.

[11] 4,110,610

[45] Aug. 29, 1978

[54] DIGITAL ELECTRICAL POSITION TRANSDUCER

[75] Inventors: William L. Mueller, Utica; Robert J. Winkel, Royal Oak, both of Mich.

[73] Assignee: Candid Logic, Inc., Hazel Park, Mich.

[21] Appl. No.: 809,997

[22] Filed: Jun. 27, 1977

Related U.S. Application Data

[63] Continuation-in-part of Ser. No. 641,630, Dec. 17, 1975.

[51] Int. Cl.² ............................................. G01D 5/34
[52] U.S. Cl. .......................... 250/231 SE; 340/347 P
[58] Field of Search ........ 250/231 R, 231 SE, 237 G; 356/169, 170; 340/347 D

[56] References Cited

U.S. PATENT DOCUMENTS 3,410,976 11/1968 Watson .......................... 250/231 SE
3,487,400 12/1969 Ludewig et al. ................. 340/347 P Primary Examiner—David C. Nelms
Attorney, Agent, or Firm—Krass & Young

[57] ABSTRACT

An electro-optical position transducer employs an optical mask having a number of parallel channels formed of alternating opaque and transparent sections extending along the direction of motion of a movable member. One channel has opaque and transparent sections, and the section lengths correspond to the smallest measureable increment. This channel generates the least significant bit of the code. A pair of channels, displaced linearly relative to one another, are provided for each of the higher order bits. Pairs of LED's and photo-transistors are provided for each channel and extend in a line normal to the length of the channel. The outputs of the photo-transistors are decoded so that all transitions between binary values in the output signal occur in synchronism with transitions of the least significant digit.

12 Claims, 5 Drawing Figures

DIGITAL ELECTRICAL POSITION TRANSDUCER

REFERENCE TO RELATED APPLICATIONS

This application is a continuation-in-part of U.S. patent application Ser. No. 641,630, filed Dec. 17, 1975.

BACKGROUND OF THE INVENTION

1. Field of the Invention

This invention relates to digital electrical, position transducers which measure the position of a plurality of parallel decoded channels formed on a mask extending parallel to the direction of motion of a movable member, relative to a bank of detectors extending transversely to the length of the channels, and more particularly to such a system wherein transitions in the binary values of each of the digits of the output occur in synchronism with transitions in the output of the least significant digit.

2. Prior Art

Electrical position transducers which sense the relative position between an elongated code member extending parallel to the direction of motion of a movable member, and a bank of detectors, one for each channel, which extend transversely to the direction of motion, fall broadly into two classes: brush and commutator devices of the type disclosed in U.S. Pat. No. 3,855,708, assigned to the assignee of the present invention, wherein channels represent conductive or non-conductive sections formed on a baseboard; and optical devices employing an elongated mask having channels encoded in the form of transparent and opaque sections and detectors employing light sources and photo-sensors, such as the structure disclosed in U.S. Pat. No. 3,223,845. These devices generate plural digit binary output signals having values representative of the relative position of the code member with respect to the detector. Typically one channel is provided on the code member for each binary digit of the output and a single detector is provided for each channel. The detectors provide a binary output signal having one value when the point on the code channel in their proximity is transparent, or conductive in the case of the commutator type, and another value when the channel section is opaque or nonconductive.

In such a device it is important that the output reading be independent of the direction of motion of the code member relative to the detectors in arriving at a particular position and that the transitions between high and low in the higher order digits of the binary output occur in exact synchronism with the transitions of the least significant digit of the output. In most prior art devices these problems have been treated by improving the precision of the coding in the mask or commutator and the precision of the detectors; however, this approach has definite limits and is highly expensive. Another arrangement has been proposed wherein a pair of detectors are provided for each channel with the exception of the least significant bit channel for which only a single detector is provided. These detector pairs are displaced with respect to one another along the length of a channel and the output signals from all of the detectors are processed with logic which only allows the switching of a particular higher order channel when all of the lower order channels switch. In devices of this sort the spacing between the two detectors that examine the same channel must be related with a high degree of accuracy to the elemental longitudinal dimension of the encoding. Not only is this distance difficult to control, but it requires that the detector set, or at least the spacing between the two members of each channel set, be changed when code plates of different elemental dimensions are employed.

SUMMARY OF THE INVENTION

The present invention is broadly directed toward a digital position transducer which provides the accuracy of bit transition and direction insensitivity available from a system which employs dual displaced detectors for the higher order digits, without the disadvantages of that system.

Broadly, the present invention employs a code plate having a single, longitudinally extending code channel for the least significant digit and a pair of code channels for each of the other digits. The pair of code channels for the higher order digits are formed with the identical code structure, but are displaced relative to one another by a precise multiple of the elementary encoding distance. A single detector is provided for each channel of the coding plate and the detectors are arrayed in a line extending transversely to the channels. The binary outputs of the detectors are provided to a logical decoding apparatus which includes a gating structure for each of the digits. The gating structure for the least significant digit is a simple function of the output of the detector for the least significant digit channel. This output, as well as the outputs from the two detectors which sense the two channels of the next most significant digit are provided to the gating structure for that digit in such a way that transitions in the output of the gating structure only occur in synchronism with the transition of the least significant digit. The output of this gating is provided to the output of the next most significant digit and so on so that all of the transitions of the digits occur in synchronism with the transition of the least significant digit.

In a preferred embodiment of the invention, which will subsequently be disclosed in detail, the code plate comprises an optical mask with the channels encoded in opaque and transparent sections. A light emitting diode is provided for each channel and the diodes are supported in a line extending transversely across the mask. A photo-detector for each channel is provided on the opposite side of the mask. The outputs of the photo-detectors are provided to a gating structure for each digit. For each of the digits except the least significant, the gating logic implements the logical equation:

$$B_n = (X_n \cdot \overline{B_{n-1}}) + (Y_n \cdot B_{n-1})$$

where $B_n$ equals the output of gating circuit $n$; $X_n$ and $Y_n$ are the outputs of the detectors for the two channels associated with digit $n$, and $B_{n-1}$ equals the output of the gating circuit for the next least significant digit. This form of gating forces the transitions to occur upon a transition in the lower order digit.

The device of the present invention has an accuracy limited only by the accuracy of formation of the least significant digit channel on the coding plate and the accuracy of placement of the detector relative to that channel. Relatively low tolerances exist for the formation of the higher order digit channels with respect to the least significant bit channel.

In transducers of the present invention code plates of differing elementary resolution lengths may be substituted for the existing code plates without any necessary alterations in the detector assembly. This is particularly useful when a variety of transducers of different lengths must be manufactured.

Other objectives, advantages and applications of the present invention will be made apparent by the following detailed description of two embodiments of the invention. The description makes reference to the accompanying drawings in which.

Figure 1:
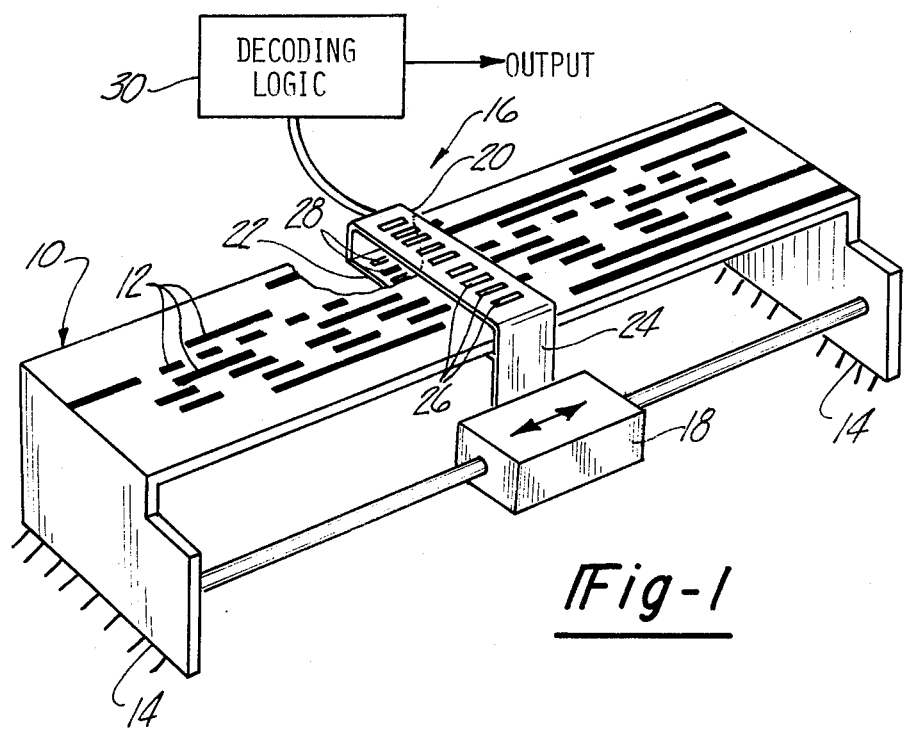
FIG. 1 is a perspective view, partially broken away for purposes of illustration, of an electro-optical transducer forming a first embodiment of the invention.

While the broad concepts of the present invention may be applied to position detection systems employing coding plates with conductive and non-conductive segments, the preferred embodiment of the invention is illustrated in connection with an optical version of the invention. This embodiment employs a coding plate which takes the form of a mask 10. The mask consists of an elongated rectangle of transparent plastic or glass, coated with an opaque paint and having a number of parallel channels of binary coding extending along its length. In the preferred embodiment of the invention the binary output signal has five binary digits and accordingly the mask 10 contains ($2 \times 5 - 1 = 9$ parallel channels 12 along its length.

The coding plate 10 is illustrated as being fixed with respect to a stationary structure 14. A detector assembly, generally indicated at 16 is supported with respect to a member 18 that is movable with respect to the coding plate 10, along the length of the coding plate, parallel to the channels 12. The member 18 may be a part of the machine or the like. In alternate embodiments of the invention the detector assembly 16 could be fixed with respect to the machine and the coding plate 10 could be movable along a line parallel to its length.

The detector assembly 16 consists of a bridge assembly having an upper section 20 which extends on one side of the coding plate 10 and a lower section 22 which extends on the opposite side of the coding plate. The upper and lower sections are joined together by end members 24 to form a closed assembly. The upper plate 20 supports an array of nine light emitting diodes (LED's) 26 in a line across its length, normally to the extension of the coding channels 12 so that one LED 26 is in alignment with each of the channels 12. Similarly, the lower plate 22 supports an array of nine photo-detectors 28 positioned one in proximity to each of the nine coding channels 12. The arrangement is such that a single light emitting diode 26 and a single photo-detector 28 are associated with each of the coding channels 12 and the light falling on a particular photo-detector from the associated LED depends upon whether an opaque or a transparent section of the mask 10 occurs in that particular channel at the point along the length of the mask 10 at which the detector assembly 16 is positioned.

The outputs of the photo-detectors 28 are provided to a decoding logic circuit 30 which generates the five digit binary signal representative of the position of the detecting assembly 16 relative to the mask 10, or the position of the movable member 18 relative to the fixed member 14, which represents the output of the system.

Figure 2:
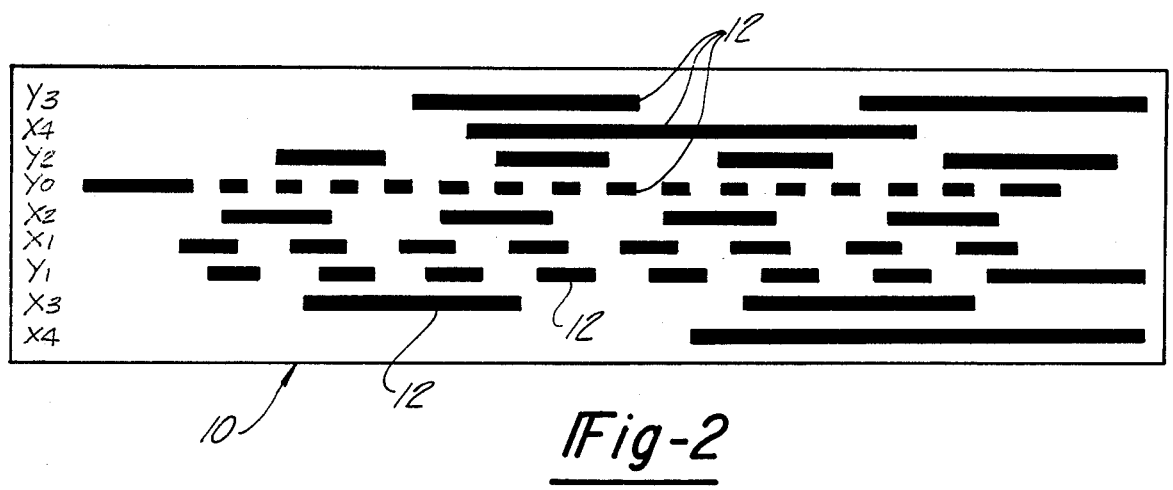
FIG. 2 is a graphic representation of the coding channels used on the optical mask of the transducer of FIG. 1.

The detailed nature of the coding channels on the coding plate 10 are illustrated in FIG. 2.

In FIG. 2 the nine coding channels are denoted Y0, Y1, Y2, Y3, X1, X2, X3 and X4. The Y0 channel is used to generate the least significant digit of the binary output code, and also condition the switching of the output for the more significant digits, as will be detailed in connection with the description of the schematic diagram of FIG. 3. The other eight channels are arranged in four pairs: X1 and Y1; X2 and Y2; X3 and Y3; and X4 and Y4. These pairs respectively encode the four most significant digits of the output code. The two members of each pair are identical to one another but are displaced from one by approximately one-quarter of the repeated pattern length.

Figure 3:
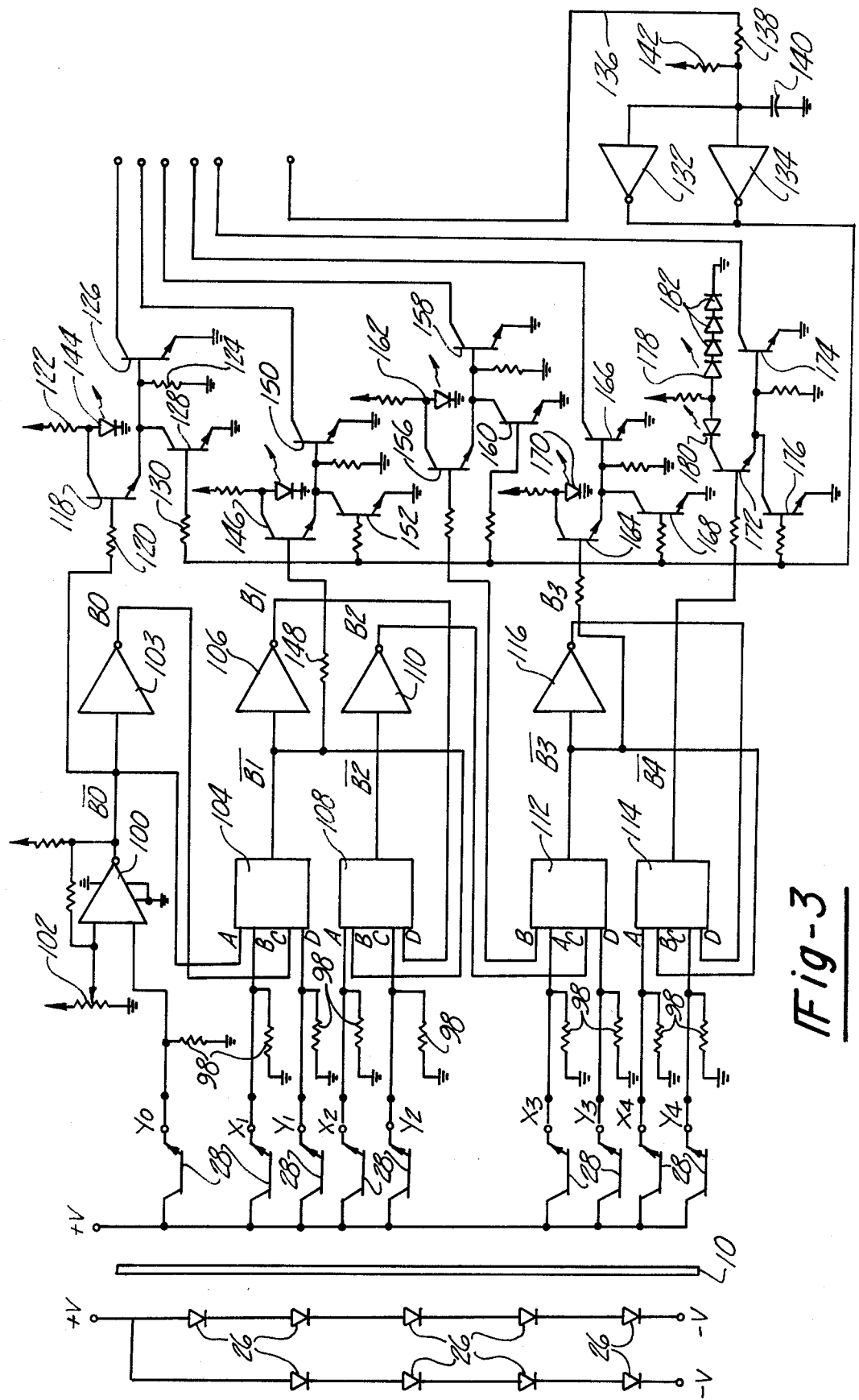
FIG. 3 is a schematic diagram of electronic circuitry for decoding the photo-sensor outputs provided by the device of FIG. 1.

Referring to FIG. 3, which details the logic 30, the nine LED's 26 are arranged in two series chains, one consisting of four LED's and the other containing five LED's connected in parallel with one another, across the appropriate power supply. The phototransistors 28 each have their collector connected to a positive voltage and their emitters connected to ground through one of a group of resistors 98. The emitters are labelled using the nomenclature Y0-Y4 and X1-X4 based upon the optical channel of the mask 10 which controls the application of light to that photo-transistor from its associated LED.

The emitter of the photo-transistor Y0 is connected to an operational amplifier 100 connected as a comparator and having its other input from a manually adjustable resistance 102. The setting of the resistance 102 controls the level of the emitter signal from Y0 which produces an output from the inverter 100. This output is applied to an inverter 103. The output of the inverter 103 is termed B0 and plotted in FIG. 4 in spacial relationship to the mask 10. The output of the inverter 100 and its inverse, or the output of the inverter 103, are applied to two of the four inputs of a digital logic device 104. The device implements the equation $$Z = \overline{(A \cdot B) + (C \cdot D)}$$

The output of the inverter 100 is applied to the A input and the output of the inverter 102 is applied to the C input. The B and D inputs respectively receive the outputs of the emitters of the photo-transistors X1 and Y1. Accordingly, the logic device 104 provides an output when the emitter of photo-transistor Y0 is above the reference level and the emitter of photo-transistor X1 is high or when the output of Y0 is below the reference level and the emitter of photo-transistor Y1 is high. The output of the logical device 104 is termed $\overline{B1}$ and is applied to an inverter 106 which generates the function of B1. That function is plotted in FIG. 4 in spacial relation to the mask.

The output of the logic unit 104, $\overline{B1}$, is provided to the B input of a second logic unit 108 which implements the same logical function as 104. The output of the inverter 106, B1, is provided to the B input of logic unit 108. The A and C inputs come from the emitters of photo-detectors X2 and Y2 respectively. The output of logic unit 108, termed $\overline{B2}$ is provided to an inverter 110 and to the B input of a third logic unit 112 which is identical to the units 104 and 108. The output of the inverter 110, termed B2, is plotted in FIG. 4 in spacial relationship to the mask 10, and this signal is provided to the C input of the logic unit 112.

Figure 4:
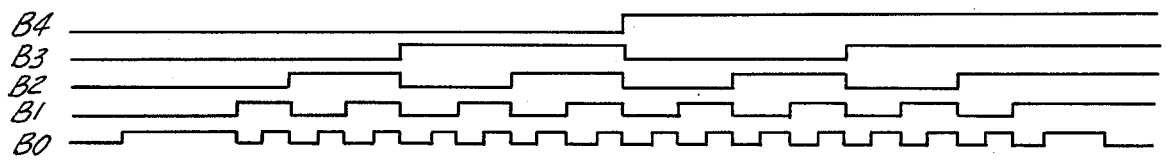
FIG. 4 is a plot of waveforms occurring in the circuit of FIG. 3 set out in positional relationship to the channels of the optical mask of FIG. 2.

The A and D inputs of the logic unit 112 are derived from the emitters of photo-transistors X3, Y3 respectively. The output of the logic unit $\overline{B3}$, is provided to the B input of a fourth logic unit 114, identical to the units 104 and 112, as well as to an inverter 116. The output of the inverter 116, termed B3, and plotted in FIG. 4, is provided to the C input of the logic unit 114. The A and D inputs of the logic unit 114 are derived from the emitters of photo-transistors X4 and Y4 respectively. The output of the logic unit 114 is termed $\overline{B4}$ and its inversion, B4, is plotted in FIG. 4.

The signal $\overline{B0}$ is also provided to the base of a transistor 118 through a current limiting resistor 120. Transistor 118 has its collector connected to a positive voltage through a resistor 122 and its emitter connected to ground through a relatively high resistance 124. The emitter is also connected to the base of an output transistor 126 that has its collector connected to an output representing the least significant bit of the five-bit binary code representing the position of the member 18. This quantity also represents $\overline{B0}$. When the input to the transistor 118 base, B0, is high, that transistor is conductive and causes transistor 126 to be conductive, dropping the output, $\overline{B0}$, to substantially ground level; when B0 is low the voltage at the collector of transistor 126 is relatively high.

Another NPN transistor 128 has its collector connected to the base of transistor 126 and its emitter connected to ground. Accordingly, when a signal applied to the base of transistor 128 through resistor 130 is high, the transistor 128 is conductive, bypassing the current normally supplied to the base of transistor 126 so that its collector remains high. In the absence of the signal on the base of transistor 128 the collector of transistor 126 can go low.

The signal to resistor 130 is derived from the outputs of a pair of inverters 132 and 134 which act as buffers for an input signal on line 136 which is applied through a resistor 138 to one side of a capacitor 140 which has its other side connected as inputs to the two inverters 132 and 134 and is also connected to positive voltage through a resistor 142. The signal on line 136 comes from an outside circuit and acts as an enabling signal for output transistor 126 and other output driving transistors for the higher digits which will subsequently be described.

A light emitting diode 144 is connected between the collector of transistor 118 and ground and accordingly is energized whenever the transistor 118 is not conductive, or in accordance with the function B0. This LED is supported on an associated panel to provide a visual indication of the signal B0.

In a similar manner, the signal $\overline{B1}$ from the output of logic unit 104 is provided to a transistor 146 through a resistor 148. Transistor 146 drives an output transistor 150 and this signal is controlled by an enabling transistor 152. A light emitting diode 154 provides a visual indication of signal B1.

The signal $\overline{B2}$, derived from the output of the logic unit 108 is provided to the base of a transistor 156 which drives an output transistor 158. The transistor 160 is driven by the outputs of the inverters 132 and 134 and controls the provision of that signal to the driving output and a light emitting diode 162 provides a visual indication of the signal B2.

The signal $\overline{B3}$ drives transistor 164 which drives output transistor 166. The signal is controlled by an enabling transistor 168 and is visually indicated by a LED 170.

The signal $\overline{B4}$ drives transistor 172 which in turn drives the output transistor 174. This signal is enabled by transistor 176. The light emitting diode arrangement in the collector circuit of transistor 172 differs from the other LED circuits. A LED 178, which is the equivalent of the LED's 144, 154, 162 and 170, provides a visual indication of the most significant digit of the output signal B4. It has its cathode connected to the cathode of another LED 180 which has its anode connected to the collector of transistor 172. Thus, when LED 178 is not conductive, LED 180 is conductive. The two are alternately conductive and are used to indicate the mid-point of the motion of member 18. One LED is conductive during the first half of the range and the other is conductive during the second half. In systems wherein the zero point of the motion is selected at this mid-point these two LED's indicate which half of the range the probe is in, its negative half or its positive half. Three diodes 182 connected in series between the anode of the LED 178 and ground are level shifting diodes which insure that LED 178 turns off when LED 180 turns on.

It should be noted that the LED's 144, 154, 162, 170 and 180 indicate status of their outputs even when the associated enabling transistors 128, 152, 160 and 176 inhibit outputs from the output transistors. Since the indicator LED's are connected between the collectors of the first driving transistor and ground, a relatively constant current is applied to these LED circuits even during switching of the enabling transistors and the output transistors.

Figure 5:
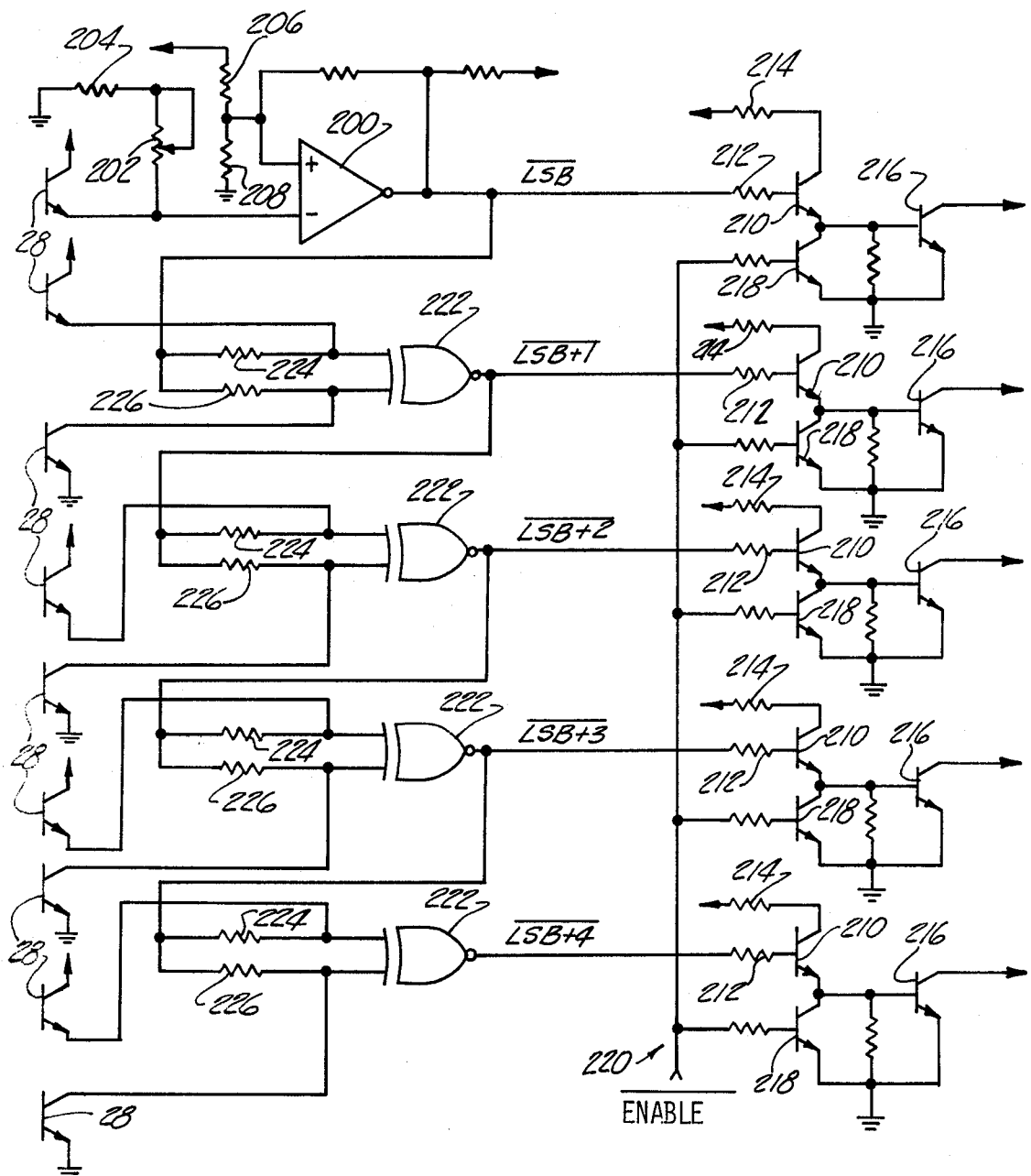
FIG. 5 is a schematic diagram of an alternative form of electronic circuitry for decoding the photo-sensor outputs, which may be employed with the device of FIG. 1.

FIG. 5 illustrates an alternative embodiment of the decoding logic 30 and its interconnections with the LED's 26 and the photodetectors 28. The photo-transistor $Y_0$ has its collector connected to a positive voltage source and its emitter connected to the minus terminal of an operational amplifier 200 connected as a comparator. The voltage at the same minus terminal of the amplifier 200 is connected to ground through a variable resistor 202 and a fixed resistor 204. The other input terminal to the comparator 200 is connected to the midpoint of a voltage divider formed of resistances 206 and 208. The setting of the variable resistor 202 determines the voltage output from the emitter of photodetector $Y_0$ which provides an output from the comparator.

This output is provided to the base of an NPN transistor 210 through a current limiting resistor 212. The collector of transistor 210 is connected to the positive terminal of the power supply through resistor 214. The emitter of transistor 210 is connected to the base of an output NPN transistor 216 which has its emitter grounded. The collector of resistor 216 represents the output of the least significant digit of the circuit.

A switching transistor 218 has its collector connected to the base of transistor 216 and its emitter connected to ground. An enable signal on line 220 connects to the base of transistor 218 and if that line is energized the output of transistor 216 is disabled. The transistor pair 210 and 216 act as an inverter and an amplifier for the output of comparator 200 which effectively represents the inversion of the least significant bit.

The output of comparator 200 is also provided to two inputs of an exclusive NOR device 222 through a pair of resistors 224 and 226. One input of the exclusive NOR 22 is also connected to the emitter of photodetector $Y_1$ and the other is connected to the collector of photodetector $X_1$. As in the description of FIG. 3, these photo-transistors detect the nature of the $Y_1$ and $X_1$ channels respectively of the coding plate. The collector of transistor $Y_1$ is connected to the positive terminal power supply and the emitter of photo-transistor $X_1$ is connected to the ground. Accordingly, the photo-transistor $Y_1$ provides a true output representative of the presence of a transparent area on the mask and the transistor $X_1$ provides an inversion of the transparent areas on its associated channel. The output of exclusive NOR gate 222 is equal to the inversion of the next to least most significant digit. This output is provided to a transistor output circuitry similar to that employing transistors 210, 216 and 218 and also an exclusive NOR gate servicing the next most significant digit.

Considering the operation of an exclusive NOR gate for a bit $N$ where the output of the next less significant stage is $B_{n-1}$ it will be seen that $$B_n = (X_n \cdot \overline{B_{n-1}}) + (Y_n \cdot B_{n-1}).$$

With this circuit, as the circuit in FIG. 3, all of the digits switch in synchronism with the transition of the least significant bit.

The embodiments of the invention in which an exclusive property or privilege is claimed are defined as follows:

1. A position transducer operative to generate an M bit, parallel, digital signal representative of the position of a first member relative to a second member along an elongate path, comprising: an elongate scale fixed to the first member so as to extend along the path, said scale having 2M-1 elongate channels extending alongside one another along the length of the scale, each channel having a digital coded characteristic which varies along the length of the scale, all of the channels, except one, belonging to a pair of channels, with both members of the pair having the same coding configuration and with one member of the pair being displaced along the length of the scale relative to the other member, and each such channel pair being operative to encode a single binary digit of a binary output signal, and the stand alone channel being coded to represent the least significant digit; 2M-1 detectors supported on the second member so as to extend transversely to the length of the scale with each detector in operative positional relationship with one of the scale channels, each detector being operative to provide an electrical output signal dependent upon the coding of the scale channel with which it is associated at the instantaneous detector position; and decoder means operative to receive the outputs of the detectors and to generate the output signals of the transducer, with transitions between the binary states of each digit in the code.

2. The elongate scale of claim 1 in which said scale consists of a mask with each channel encoded optically with relatively transparent and opaque sections and the detectors comprise photodetectors operative to sense passage of light through the mask sections.

3. The transducer of claim 1 in which said decoding logic includes a plurality of gating structures, one associated with each digit of the binary output, and gating structures for each of the digits with the exception of the least significant digit, receive the outputs from the pair of detectors associated with the two channels representative of that digit.

4. The transducer of claim 3 in which the gating structure associated with each digit of the binary output signal receives a conditioning input from the output of the gating structure associated with the next least significant digit so that a transition in the output of any gating structure occurs in synchronism with transitions in the outputs of all gating structures associated with less significant digits.

5. The transducer of claim 4 wherein the gating structure for each binary output digit other than the least most significant implements the following logical equation:

$$B_n = (X_n \cdot \overline{B_{n-1}}) + (Y_n \cdot B_{n-1})$$

where $B_n$ equals the output state of the gating in question $X_n$ and $Y_n$ are the outputs of the two detectors associated with the two scale channels associated with that binary digit, and $B_{n-1}$ is the output of the gating structure for the next least significant digit.

6. The transducer of claim 5 wherein each gating structure employs an exclusive NOR logic gate.

7. The detector/emitter array of claim 1 including a plurality of light sources, one associated with each channel of the scale, the light source being arrayed along two lines extending normally to the length of the scale on the opposite side of the scale from the photodetectors so that each photodetector receives the light output of one of the sources.

8. The detector/emitter array of claim 7 wherein the light sources each consist of light emitting diodes.

9. The transducer of claim 1 including an output circuit for each binary digit, each output signal including a gate device, with all the gate devices being controlled by a common signal.

10. A transducer operative to generate an M digit binary, parallel electrical signal encoding the position of a first member movable along a line relative to a second member, comprising: an optical mask supported on one of said members, said mask comprising a long plate oriented in a direction of motion of the first member relative to the second member and having 2M−1 channels formed thereon, each channel consisting of a series of optically opaque and transparent sections extending along the length of the mask, the channels each being associated with one binary output digit of the transducer, with all of the digits except the least most significant having a pair of channels associated with it, the members of each channel pair having identical forms of coding but being displaced relative to one another along the length of the mask, the distance along the length of the mask between transparent and opaque transitions for each channel being least for the single channel associated with the least significant digit of the output and increasing with the significance of the digit with which a channel pair is associated; an optical source supported on one side of the mask and fixed with respect to the second member; 2M−1 photodetectors supported in lines and extending transversely to the direction of motion of said first member on the side of the mask opposite to the optical source, with one detector being associated with each mask channel and being operative to provide an electrical output signal having one value when a transparent section on the channel associated with that detector is in proximity to the detector and a second value when an opaque section of such channel is in proximity to the detector; and decoding logic operative to receive the outputs of each of the detectors and to generate the output signals of the transducers.

11. The transducer of claim 10 in which said decoding logic generates transitions in the output signal of all digits more significant than the least significant digit in synchronism with transitions in the output signal representative of the least significant digit.

12. The transducer of claim 10 wherein the decoding logic implements the logical equation:

$$B_n = (X_n \cdot \overline{B_{n-1}}) + (Y_n \cdot B_{n-1})$$

where $B_n$ equals the output of the decoding logic for each digit, $X_n$ and $Y_n$ equal the outputs of the two detectors associated with the two channels associated with a particular digit and $B_{n-1}$ equals the output of the transducer for the next less significant binary signal.

* * * * *

UNITED STATES PATENT OFFICE
CERTIFICATE OF CORRECTION

Patent No. 4,110,610          Dated August 29, 1978

Inventor(s) William J. Mueller and Robert J. Winkel

It is certified that error appears in the above-identified patent and that said Letters Patent are hereby corrected as shown below:

Column 5, line 29 "$\overline{B0}$" should be --B0--.

line 30 "B0" should be --$\overline{B0}$--.

line 32 "$\overline{B0}$" should be --B0--.

line 33 "B0" should be --$\overline{B0}$--.

Column 7, line 7   "NOR 22" should be --NOR 222--.

Column 8, line 18 "$\overline{(X_n \cdot B_{n-1})}$ should be --$(X_n \cdot B_{n-1})$--.

Signed and Sealed this

Twenty-ninth Day of July 1980

[SEAL]

Attest:

SIDNEY A. DIAMOND

Attesting Officer        Commissioner of Patents and Trademarks